US008483411B2

(12) United States Patent
Oh et al.

(10) Patent No.: US 8,483,411 B2
(45) Date of Patent: Jul. 9, 2013

(54) METHOD AND AN APPARATUS FOR PROCESSING A SIGNAL

(75) Inventors: Hyen-O Oh, Gwacheon-si (KR); Yang Won Jung, Seoul (KR)

(73) Assignee: LG Electronics Inc., Seoul (KR)

( * ) Notice: Subject to any disclaimer, the term of this patent is extended or adjusted under 35 U.S.C. 154(b) by 224 days.

(21) Appl. No.: 12/811,329

(22) PCT Filed: Dec. 31, 2008

(86) PCT No.: PCT/KR2008/007871
§ 371 (c)(1), (2), (4) Date: Jun. 30, 2010

(87) PCT Pub. No.: WO2009/084920
PCT Pub. Date: Jul. 9, 2009

(65) Prior Publication Data

US 2010/0284550 A1 Nov. 11, 2010

Related U.S. Application Data

(60) Provisional application No. 61/033,031, filed on Mar. 3, 2008, provisional application No. 61/018,490, filed on Jan. 1, 2008.

(51) Int. Cl.
*H04B 1/00* (2006.01)
*H04R 5/00* (2006.01)
*H04R 1/40* (2006.01)
*H03G 5/00* (2006.01)

(52) U.S. Cl.
USPC ................. 381/119; 381/17; 381/18; 381/19; 381/97; 381/98

(58) Field of Classification Search
USPC ................. 381/17–19, 119, 97, 98, 300, 307, 381/309, 310
See application file for complete search history.

(56) References Cited

U.S. PATENT DOCUMENTS

2006/0045291 A1 3/2006 Smith
2006/0165184 A1 7/2006 Purnhagen et al.

FOREIGN PATENT DOCUMENTS

JP 2008-519491 A 6/2008
JP 2009-501948 A 1/2009

(Continued)

OTHER PUBLICATIONS

3GPP, "Digital cellular telecommunications systems (Phase 2+); Universal Mobile Telecommunications System (UMTS); Audio codec processing functions; Extended Adaptive Multi-Rate—Wideband (AMR-WB+) codec; Transcoding functions", ETSI TS 126 290, V7.0.0, Mar. 2007, 87 pages provided.

*Primary Examiner* — Duc Nguyen
*Assistant Examiner* — George Monikang
(74) *Attorney, Agent, or Firm* — Birch, Stewart, Kolasch & Birch, LLP

(57) ABSTRACT

An apparatus for processing a signal and method thereof are disclosed. The present invention includes receiving a downmix signal generated from a plural-channel signal, mix information and phase shift information on the plural-channel signal, upmixing the downmix signal into the plural-channel signal by applying the mix information to the downmix signal, and generating an original plural-channel signal by shifting a phase of at least one channel of the plural-channel signal based on the phase shift information. According to the present invention compensate a reconstructed original plural-channel signal using compensation information (phase shift information), thereby compensating a phase or a gain lost in the plural-channel signal reconstructed by upmixing using mix information.

11 Claims, 8 Drawing Sheets

FOREIGN PATENT DOCUMENTS

| | | | |
|---|---|---|---|
| JP | 2009-512893 | A | 3/2009 |
| KR | 10-2007-0081735 | A | 8/2007 |
| WO | WO 2005/086139 | A1 | 9/2005 |
| WO | WO 2006/003813 | A1 | 1/2006 |
| WO | WO 2006/048204 | A1 | 5/2006 |
| WO | WO 2006/050112 | A2 | 5/2006 |
| WO | WO 2007/009548 | A1 | 1/2007 |
| WO | WO 2007/046660 | A1 | 4/2007 |

METHOD AND AN APPARATUS FOR PROCESSING A SIGNAL

CROSS REFERENCE TO RELATED APPLICATIONS

This application is the National Phase of PCT/KR2008/007871 filed on Dec. 31, 2008, which claims priority under 35 U.S.C. 119(e) to U.S. Provisional Application Nos. 61/018,490 filed on Jan. 1, 2008, and 61/033,031 filed on Mar. 3, 2008, all of which are hereby incorporated by reference into the present application.

TECHNICAL FIELD

The present invention relates to an apparatus for processing a signal and method thereof. The present invention is particularly suitable for improving a sound quality of signal using compensation information additionally to compensate for information lost in a process of encoding/decoding for an audio signal.

BACKGROUND ART

Generally, it is able to reconstruct a plural-channel signal from a downmix signal using mix information that includes inter-channel correlation information, channel level difference information, gain information and the like.

DISCLOSURE OF THE INVENTION

Technical Problem

However, since there exists information lost in case of reconstructing a plural-channel signal from a downmix signal using mix information, a gain may not be accurately applied to the downmix signal or a phase difference or a delay difference existing between the reconstructed channels may not be correctly reconstructed.

Technical Solution

Accordingly, the present invention is directed to an apparatus for processing a signal and method thereof that substantially obviate one or more of the problems due to limitations and disadvantages of the related art.

An object of the present invention is to provide an apparatus for processing a signal and method thereof, by which a sound quality can be enhanced in a manner of applying additionally compensation information to a decoded audio signal or a decoded speech signal.

Advantageous Effects

Accordingly, the present invention provides the following effects or advantages.

First of all, an apparatus for processing a signal and method thereof according to the present invention compensate a reconstructed plural-channel signal using compensation information, thereby complementing information or signal lost in the plural-channel signal reconstructed by upmixing using mix information.

Secondly, an apparatus for processing a signal and method thereof according to the present invention shifts a phase of a decoded audio or speech signal based on phase shift information, thereby efficiently reproducing a phase difference or a delay difference, which is difficult to be efficiently reproduced by decoding using mix information (inter-channel correlation information, channel level difference information, etc.) on channel signals constructing a downmix signal.

Thirdly, an apparatus for processing a signal and method thereof according to the present invention determines whether to shift a phase of a decoded audio or speech signal based on phase shift information, thereby outputting a stereo signal according to an extent of a phase difference or a delay difference or outputting a phase-shifted stereo signal.

DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

BEST MODE

Figure 1:
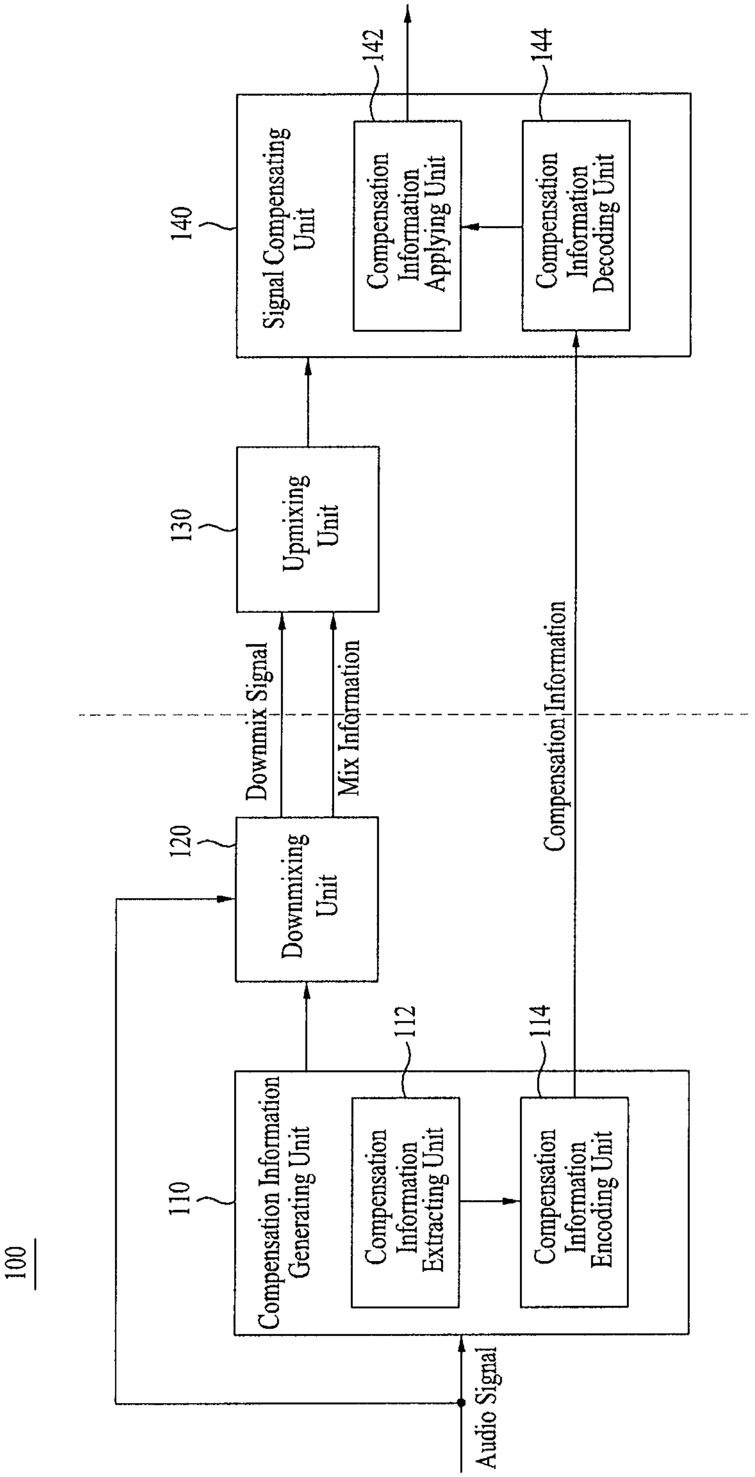
FIG. 1 is a schematic block diagram of a signal processing apparatus according to one embodiment of the present invention.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, a method of processing a signal according to the present invention includes receiving a downmix signal generated from a plural-channel signal, mix information and phase shift information on the plural-channel signal, upmixing the downmix signal into the plural-channel signal by applying the mix information to the downmix signal, and generating an original plural-channel signal by shifting a phase of at least one channel of the plural-channel signal based on the phase shift information.

According to the present invention, the original plural-channel signal is shifted the phase of the at least one channel by $\pi/2$.

According to the present invention, the original plural-channel signal is shifted the at least one channel by a same phase for a whole frequency band.

According to the present invention, the downmix signal includes a whole band downmix signal being reconstructed high-frequency band using low-frequency band downmix signal, the low-frequency band downmix signal being coded by at least one of a speech coding scheme and an audio coding scheme.

According to the present invention, the phase shift information is variable per frame.

According to the present invention, the phase shift information is variable per subband.

According to the present invention, the generating the original plural-channel signal further uses gain compensation information to compensate a gain lost in generating the downmix signal.

According to the present invention, a method of processing a signal according to the present invention includes receiving a downmix signal generated from a plural-channel signal, mix information and gain compensation information on the plural-channel signal; upmixing the downmix signal into the plural-channel signal by applying the mix information to the downmix signal; and generating an original plural-channel signal by adjusting a gain of at least one channel of the plural-channel signal based on the gain compensation information.

To further achieve these and other advantages and in accordance with the purpose of the present invention, an apparatus for processing a signal according to the present invention includes a signal receiving unit receiving a downmix signal generated from a plural-channel signal, mix information on the plural-channel signal and phase shift information on the plural-channel signal, an upmixing unit upmixing the downmix signal into the plural-channel signal by applying the mix information to the downmix signal, and a signal shifting unit generating an original plural-channel signal based on the phase shift information, wherein a phase of at least one channel of the plural-channel signal is shifted.

It is to be understood that both the foregoing general description and the following detailed description are exemplary and explanatory and are intended to provide further explanation of the invention as claimed.

MODE FOR INVENTION

Reference will now be made in detail to the preferred embodiments of the present invention, examples of which are illustrated in the accompanying drawings. First of all, terminologies in the present invention can be construed as the following references. And, terminologies not disclosed in this specification can be construed as the following meanings and concepts matching the technical idea of the present invention. Therefore, the configuration implemented in the embodiment and drawings of this disclosure is just one most preferred embodiment of the present invention and fails to represent all technical ideas of the present invention. Thus, it is understood that various modifications/variations and equivalents can exist to replace them at the timing point of filing this application.

In the present invention, it is understood that ‘coding’ can be construed as encoding or coding in a specific case.

In this disclosure, ‘information’ is the terminology that generally includes values, parameters, coefficients, elements and the like and its meaning can be construed as different occasionally, by which the present invention is non-limited. Although a stereo signal is described as an example of a signal in this disclosure, it is understood that the signal in this disclosure can include a multi-channel signal having at least three or more channels.

FIG. 1 shows a signal encoding apparatus 100 according to one embodiment of the present invention.

Referring to FIG. 1, a signal encoding apparatus 100 includes a compensation information generating unit 110, a downmixing unit 120, an upmixing unit 130 and a signal compensating unit 140.

The compensation information generating unit 110 receives an input of an audio signal and a compensation information extracting unit 112 then extracts compensation information. In this case, the compensation information is provided to compensate for information lost in a process of encoding/decoding for an audio signal and compensates mix information of a related art. The compensation information includes phase shift information and gain compensation information, whereas the mix information includes inter-channel level information, inter-channel correlation information, gain information and the like. The phase shift information and the gain compensation information shall be explained in detail with reference to FIG. 2 and FIG. 3 later. Meanwhile, the extracted compensation information is encoded by a compensation information encoding unit 114 and is then outputted from an encoder. A bitstream structure of the compensation information shall be explained with reference to FIG. 7.

The downmixing unit 120 receives an input of the compensation information and an input of the audio signal and then generates a downmix signal and mix information. The downmix signal and the mix information can be generated from an audio signal compensated using the compensation information. The compensation information is inputted to the downmixing unit 120 but may not play a role at all.

The upmixing unit 130 is able to generate a plural-channel signal by upmixing the downmix signal using the mix information. The ‘upmixing’ means that an upmixing matrix is applied to generate a channel signal having channels more than those of the downmix signal. And, an upmixed signal means a signal to which the upmixing matrix is applied. Therefore, the plural-channel signal is the signal having channels more than those of the downmix signal. The plural-channel signal can be the signal itself to which the upmixing matrix is applied. The plural-channel signal can be a QMF-domain signal having plural channels by applying to the upmixing matrix. And, the plural-channel signal can be a final signal generated from converting the QMF-domain signal to a time-domain signal.

A compensation information decoding unit 144 of the signal compensating unit 140 first decodes the inputted compensation information. The decoded compensation information is inputted to a compensation information applying unit 142 together with the plural-channel signal and then compensates the plural-channel signal. In this case, the compensation information can include information on QMF domain and the plural-channel signal can include a QMF-domain signal, by which examples of the compensation information are non-limited.

Thus, a sound quality can be enhanced by compensating information lost in a process of encoding/decoding for an audio signal in a manner of further applying compensation information to an upmixed plural-channel signal.

The compensation information for complementing information lost in a process of encoding/decoding for an audio signal includes phase shift information for complementing a loss due to a phase difference and gain compensation information for complementing gain information lost in a downmix process, which is explained with reference to FIG. 2 and FIG. 3 as follows.

Figure 2:
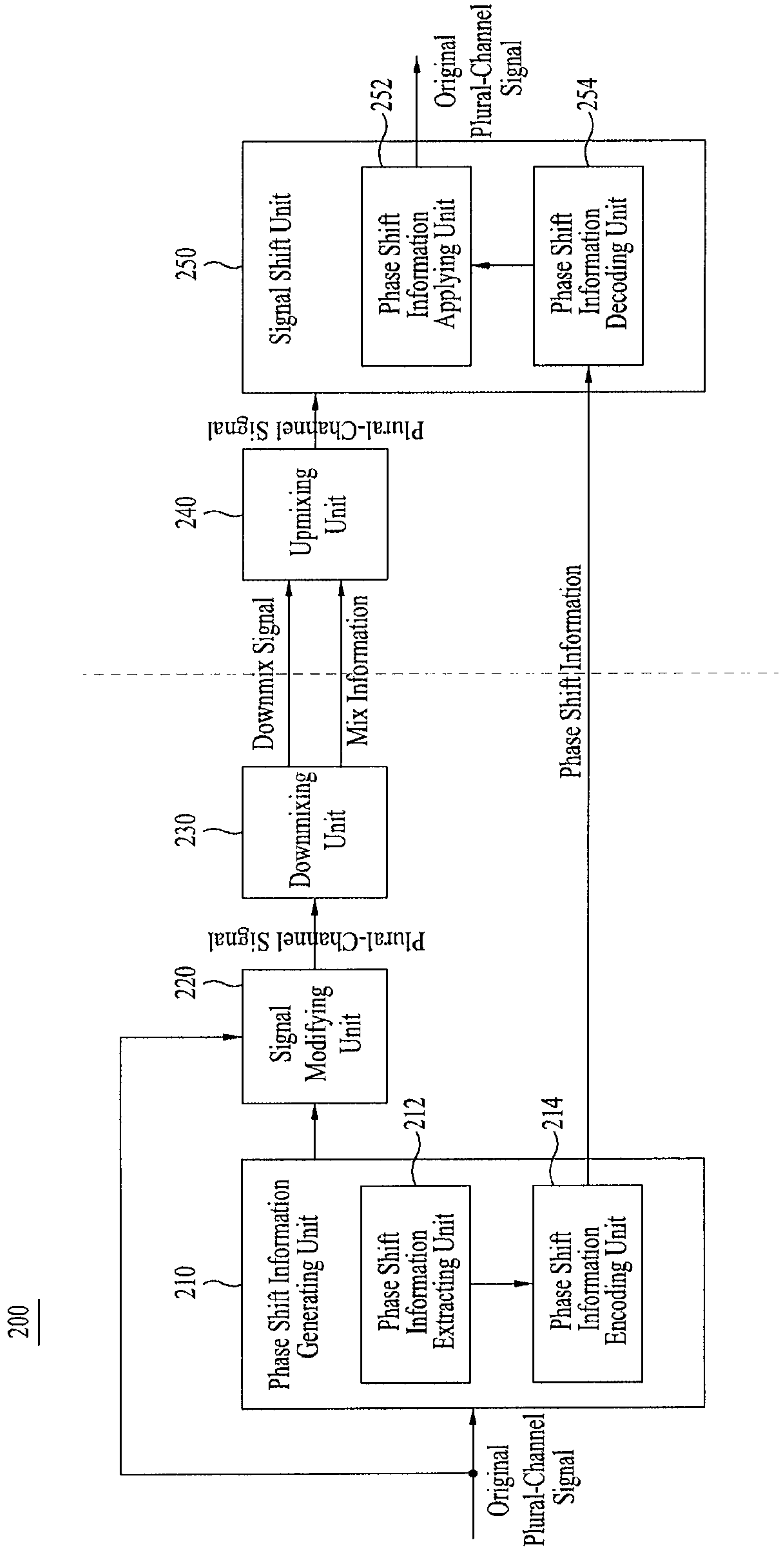
FIG. 2 is a schematic block diagram of a signal processing apparatus according to another embodiment of the present invention.

FIG. 2 shows a signal processing apparatus 200 for complementing a plural-channel signal reconstructed using phase shift information.

Referring to FIG. 2, a signal processing apparatus 200 includes a phase shift information generating unit 210, a signal modifying unit 220, a downmixing unit 230, an upmixing unit 240 and a signal shift unit 250.

First of all, the phase shift information generating unit 110 first receives an input of an original plural-channel signal. The original plural-channel signal has at least one channel no to mach other channels of the plural-channel signal. The original plural-channel signal may include a stereo signal or a signal having at least three or more channels.

The phase shift information extracting unit 210 extracts phase shift information, which indicates an extent of a phase to be shifted to match a phase of the inputted original plural-channel signal, from the original plural-channel signal. The extracted phase shift information is encoded and transferred by a phase shift information encoding unit 214.

The phase shift information can be flag information (bsPhase) indicating that a phase of the original plural-channel has been shifted. The phase shift information can further include such information relevant to a phase shift as an extent of a shifted phase, a phase-shifted channel signal, a phase-shift occurring frequency band, time information corresponding to the phase shift and the like as well as the flag information.

First of all, if the phase shift information indicates the flag information (bsPhase) only, a phase of the original plural-channel signal is shifted using a fixed value. Hence, it is able to generate the plural-channel signal. For instance, in case that the original plural-channel signal is a stereo signal, it is able to generate the plural-channel signal by shifting a phase to have left and right channels become orthogonal to each other in a manner of decreasing a phase of the right channel of the stereo signal by $\pi/2$ or increasing a phase of the left channel of the stereo signal by $\pi/2$. Alternatively, it is able to generate the plural-channel signal by shifting phases to have the left and right channels become orthogonal to each other instead of being limited to the phase shift by $\pi/2$.

In this case, it is able to generate the plural-channel signal in a manner that the shifted phase is identically applied to a whole frequency band of the original plural-channel signal. Moreover, instead of separately transferring information indicating that a phase of at least one channel of the original plural-channel signal is modified by $\pi/2$ or information on a phase shifted to be orthogonal, it is able to use information preset in a decoder side in the future, by which the present invention is non-limited.

The phase shift information can further include detailed information relevant to a phase shift as well as the flag information (bsPhase). This detailed information can include a phase-shifted extent, a phase-shifted channel signal, a phase-shifted frequency band and time information. In this case, it is able to determine the phase shifted extent by measuring a delay that is based on cross-correlation information of the original plural-channel signal inputted to the phase shift information extracting unit 212.

Meanwhile, the phase shift information is able to variably indicate a shifted extent of a phase of the plural-channel signal per frame. In case that the phase shift information includes the flag information only, it is able to indicate whether a phase is shifted per frame. Moreover, in case that the phase shift information includes flag information and detailed information on a phase shift, the detailed information is able to variably indicate a shifted extent of a phase per subband and is also able to indicate a shifted extent of a phase in a corresponding time per predetermined time range.

The signal modifying unit 220 receives the phase shift information and the original plural-channel signal. In this case, it is able to generate a plural-channel signal from the original plural-channel signal by modifying a phase of at least one channel using the phase shift information. As mentioned in the foregoing description, phase shift information is generated by modifying an out-of-phase original plural-channel signal into an in-phase original plural-channel signal and phase shift information is then generated. Alternatively, an in-phase plural-channel signal is intentionally phase-shifted into an out-of-phase signal and it is then bale to generate phase shift information corresponding to the out-of-phase signal.

The downmixing unit 230 receives the plural-channel signal and is then bale to generate a downmix signal and mix information. In this case, the plural-channel signal can include a signal having at least three channels as well as a stereo signal. In case that the plural-channel signal is the signal having at least three channels, the downmix signal can be a stereo downmix signal or a downmix signal having at least three channels.

The downmixing unit 230 is able to generate mix information indicating attributes of the plural-channel signal. In this case, the mix information is provided for a decoder to decode the downmix signal into the plural-channel signal. And, the mix information can include channel level difference (CLD) information, channel prediction coefficient, inter-channel correlation (ICC) information, etc.

Moreover, a bitstream generating unit (not shown in the drawing) is able to generate one bitstream containing the downmix signal, the mix information and the phase shift information.

Meanwhile, an input signal configuring the downmix signal is not limited to the plural-channel signal but can include a multi-object signal constructed with at least one object signal. In this case, it is understood that the mix information is the information on the multi-object signal.

The upmixing unit 240 has the same configuration of the former upmixing unit 130 shown in FIG. 1 and also plays the same role thereof. A reconstructed plural-channel signal can include a signal upmixed by having an upmixing matrix applied thereto, a signal generated on QMF domain by upmixing or a signal finally outputted as a signal on time domain.

The signal shifting unit 250 receives the phase shift information. A phase shift information decoding unit 254 decodes the received phase shift information. A phase shift information applying unit 252 then reconstructs an original plural-channel signal by applying the phase shift information to the inputted plural-channel signal.

The phase shift information decoded by the phase shift information decoding unit 254 can just contain flag information indicating whether a phase of the plural-channel signal is shifted. In this case, the phase shift information can be variably contained per frame and its meaning is illustrated in Table 1.

TABLE 1

| bsPhase | Meaning |
|---|---|
| 1 | Phase shift information is applied to plural-channel signal. |
| 0 | Phase shift information is not applied to plural-channel signal. |

In case that the phase shift information (bsPhase) indicates that phase shift information is applied to a plural-channel signal, the phase shift information applying unit 252 is able to reconstruct an original plural-channel signal by applying the phase shift information to the plural-channel signal.

First of all, in case that the phase shift information is flag information, it is ale to reconstruct an original plural-channel signal by shifting a phase of the plural-channel signal using a fixed value. For instance, it is able to increase or decrease at least one channel of the plural-channel signal by $\pi/2$ or it is able to shift a phase to enable the plural-channel signal to become orthogonal. In this case, a value preset in a decoder is used as the '$\pi/2$' or a size of the phase shifted for orthogonality and is not separately measured and transferred by an encoder.

In this case, it is able to generate the original plural-channel signal by identically applying the '$\pi/2$' or a size of the phase shifted for orthogonality to a whole frequency band.

Secondly, in case that the phase shift information further contains detailed information relevant to a phase shift as well as the flag information (bsPhase), it is able to reconstruct an original plural-channel signal using the detailed information. In this case, the detailed information contains a phase-shifted extent, a phase-shifted channel signal, a phase-shifted frequency band, time information corresponding to a phase shift and the like and is able to further contain information for inverse transform. And, the phase-shifted extent may be determined using a delay based on cross-correlation information of an original plural-channel signal inputted from an encoder.

Meanwhile, the phase shift information is able to variably indicate a phase-shifted extent of the plural-channel signal per frame. If the phase shift information contains flag information only, it is able to indicate whether a phase is shifted per frame. In case that the phase shift information contains flag information and detailed information on a phase shift, the detailed information is able to variably indicate a phase-shifted extent per subband or a phase-shifted extent in a corresponding time per predetermined time range.

Thus, the phase shift information applying unit 252 further uses the phase shift information in addition to the mix information in order to reconstruct the plural-channel signal into the original plural-channel signal. In case that the downmix signal is decoded using the mix information, a phase difference, a delay difference and the like, which are difficult to be reconstructed due to a loss occurrence, can be efficiently reproduced.

Figure 3:
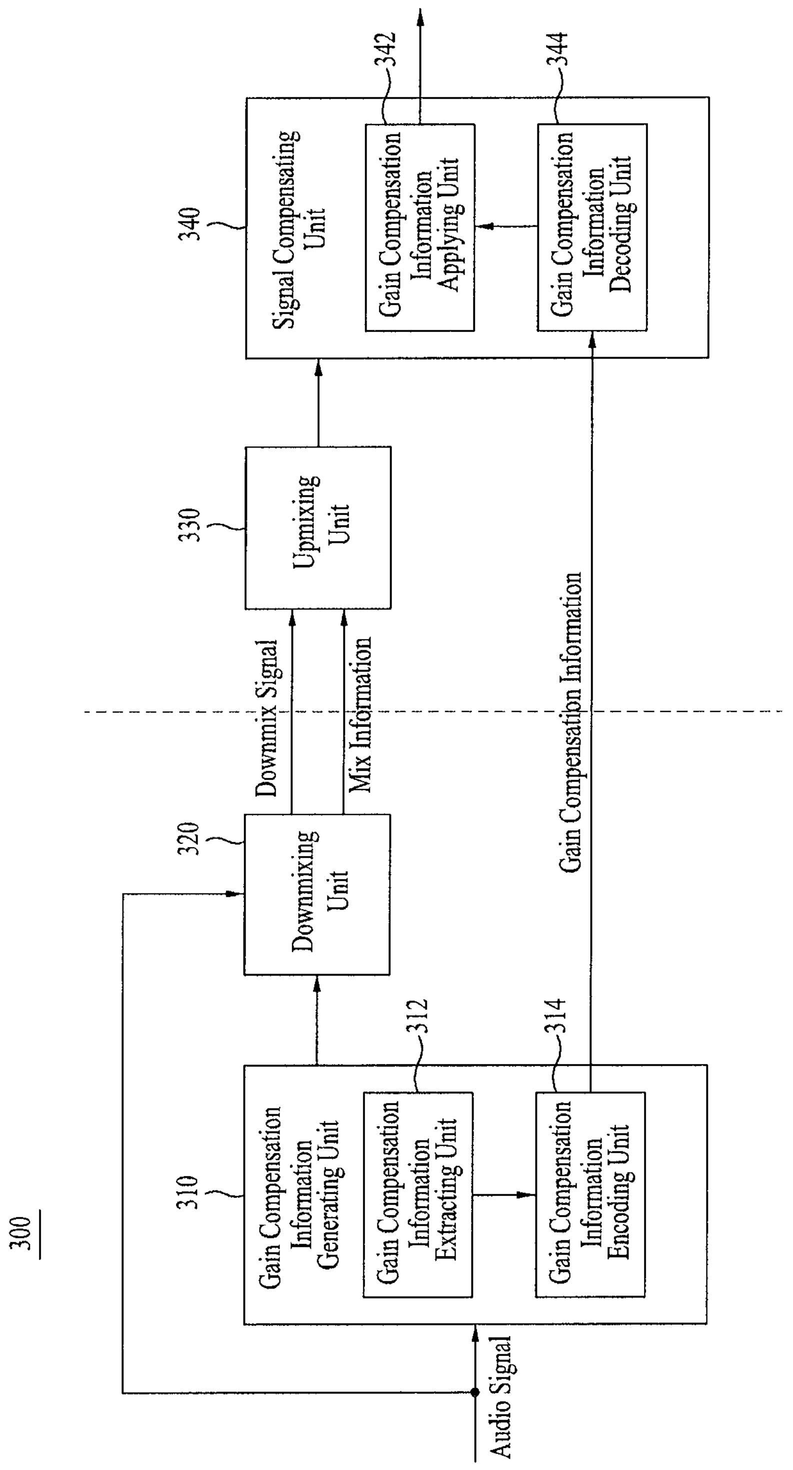
FIG. 3 is a schematic block diagram of a signal processing apparatus according to another embodiment of the present invention.

FIG. 3 shows a signal processing apparatus 300 for complementing lost mix information using gain compensation information.

Referring to FIG. 3, a signal processing apparatus 300 includes a gain compensation information generating unit 310, a downmixing unit 320, an upmixing unit 330 and a signal compensating unit 340. Basic configurations and roles of the downmixing unit 320 and the upmixing unit 33 are identical to those of the former downmixing and upmixing units 120 and 130 shown in FIG. 1, of which details shall be omitted in the following description.

The gain compensation information unit 310 includes a gain compensation information extracting unit 312 and gain compensation information encoding unit 314. In case that a plural-channel signal having plural channels is inputted to the gain compensation information extracting unit 312, gain compensation information for compensating of a gain value to be lost in downmixing is extracted. The gain compensation information is not identical to gain information contained in mix information. For instance, the gain compensation information may include a sum of powers of the channels of the plural-channel signal and can further include a power of each of the channels. The gain compensation information is encoded by the gain compensation information encoding unit 314 and is then transferred as separate information.

A gain compensation information decoding unit 344 of the signal compensating unit 340 receives the transferred gain compensation information, decodes the received gain compensation information, and then inputs the decoded gain compensation information to a gain compensation information applying unit 342.

The gain compensation information applying unit 342 compensates the plural-channel signal by compensating for the lost information in a manner of applying the gain compensation information to the plural-channel signal reconstructed by being upmixed by the upmixing unit 330.

In case that the downmixing unit 320 downmixes the plural-channel signal into the downmix signal, even of gain information, which is transferred to a decoder by being contained in the mix information if a loss is generated from a gain value, is applied to the downmix signal, it is unable to reconstruct the plural-channel signal as it is. Hence, a plural-channel signal having a loss is reconstructed. In this case, it is able to compensate the lost signal by adjusting a level of the lost plural-channel signal using a power sum of the plural-channel signal or a power of each channel.

Meanwhile, if the gain compensation information is inputted to the upmixing unit 330, an upmixing matrix is modified. The modified upmixing matrix is applied to the downmix signal, whereby the plural-channel signal can be reconstructed without loss.

Moreover, the gain compensation information is additionally used by the signal processing apparatus shown in FIG. 2, whereby an original plural-channel signal can be effectively reconstructed without loss.

In a method and apparatus for processing a signal according to the present invention, the compensation information is usable by being generated or decoded according to a related art signal processing method, by which the present invention is non-limited. Thus, compensation information is generated and decoded to be usable using a unit for generating and decoding a conventional residual signal, whereby compatibility with a signal processing apparatus using a related art residual signal can be secured.

Figure 4:
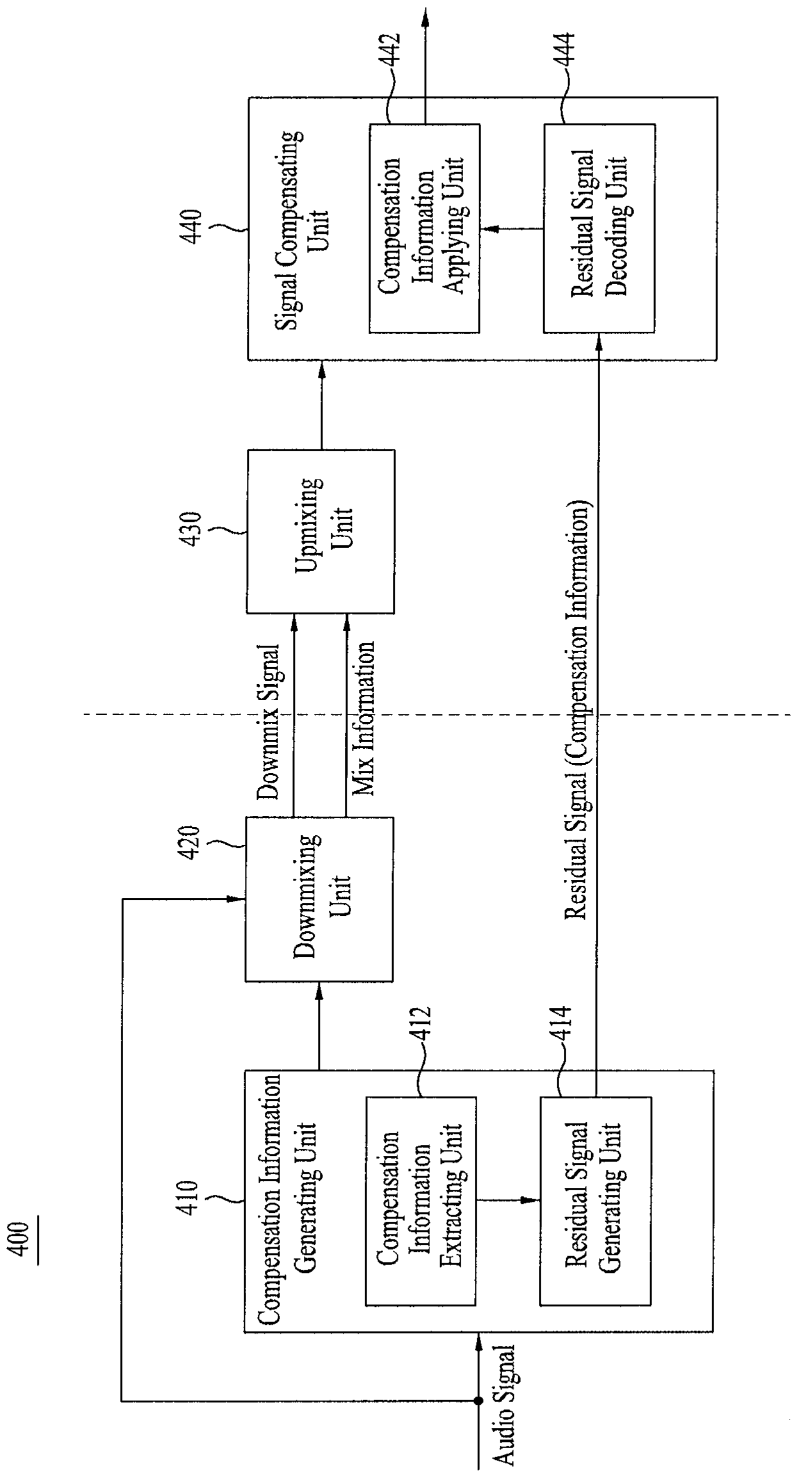
FIG. 4 is a schematic block diagram of a signal processing apparatus using a conventional residual coding scheme according to another embodiment of the present invention.

Referring to FIG. 4, the compensation information encoding unit 114 shown in FIG. 1 is replaced by a residual signal generating unit 414 and the compensation information decoding unit 144 shown in FIG. 1 is replaced by a residual signal decoding unit 444. Therefore, compatibility can be secured in a manner of generating and decoding compensation information by a related art residual coding scheme.

The residual signal generating unit 414 generates compensation information to a separate channel stream located in an extension region of a bitstream and then transfers the channel stream. The residual signal decoding unit 444 obtains MDCT (modified discrete coefficient transform) coefficient by decoding the compensation information contained in the separate channel stream and then compensates and then transforms it into signal in a QMF-domain. And, a compensation information applying unit 442 compensates an upmixed plural-channel signal by applying the QMF-domain type to a plural-channel signal.

Figure 5:
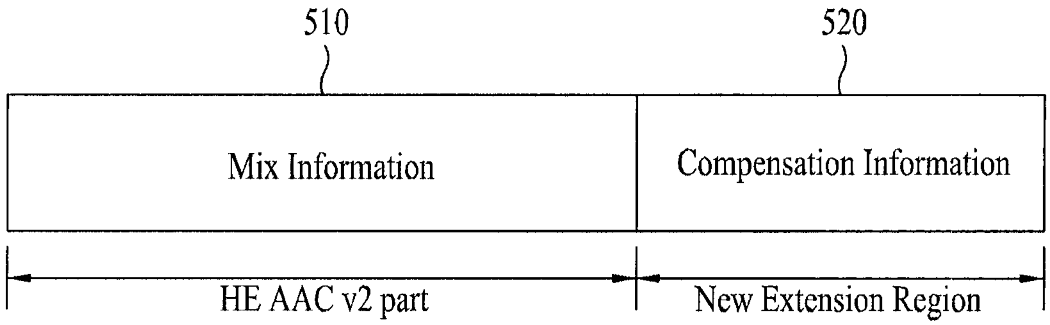
FIG. 5 is a diagram of a bitstream structure of compensation information of the present invention.

FIG. 5 shows a bitstream structure of compensation information of the present invention.

Referring to FIG. 5, mix information 510 is mandatory information to be transferred but compensation information 520 is selectively usable. The compensation information 520 is contained in a new extension region additionally located at a tail part of a conventional bitstream.

Therefore, the compensation information 520 is not decodable by such a conventional decoder as HE-AAC v2 but is decodable by a decoder that supports the new extension region, thereby having lower compatibility.

Moreover, the compensation information of the present invention is usable for a plural-channel encoding unit and a plural-channel decoding unit included in a signal processing apparatus for coding a speech signal and/or an audio signal according to a proper scheme.

Figure 6:
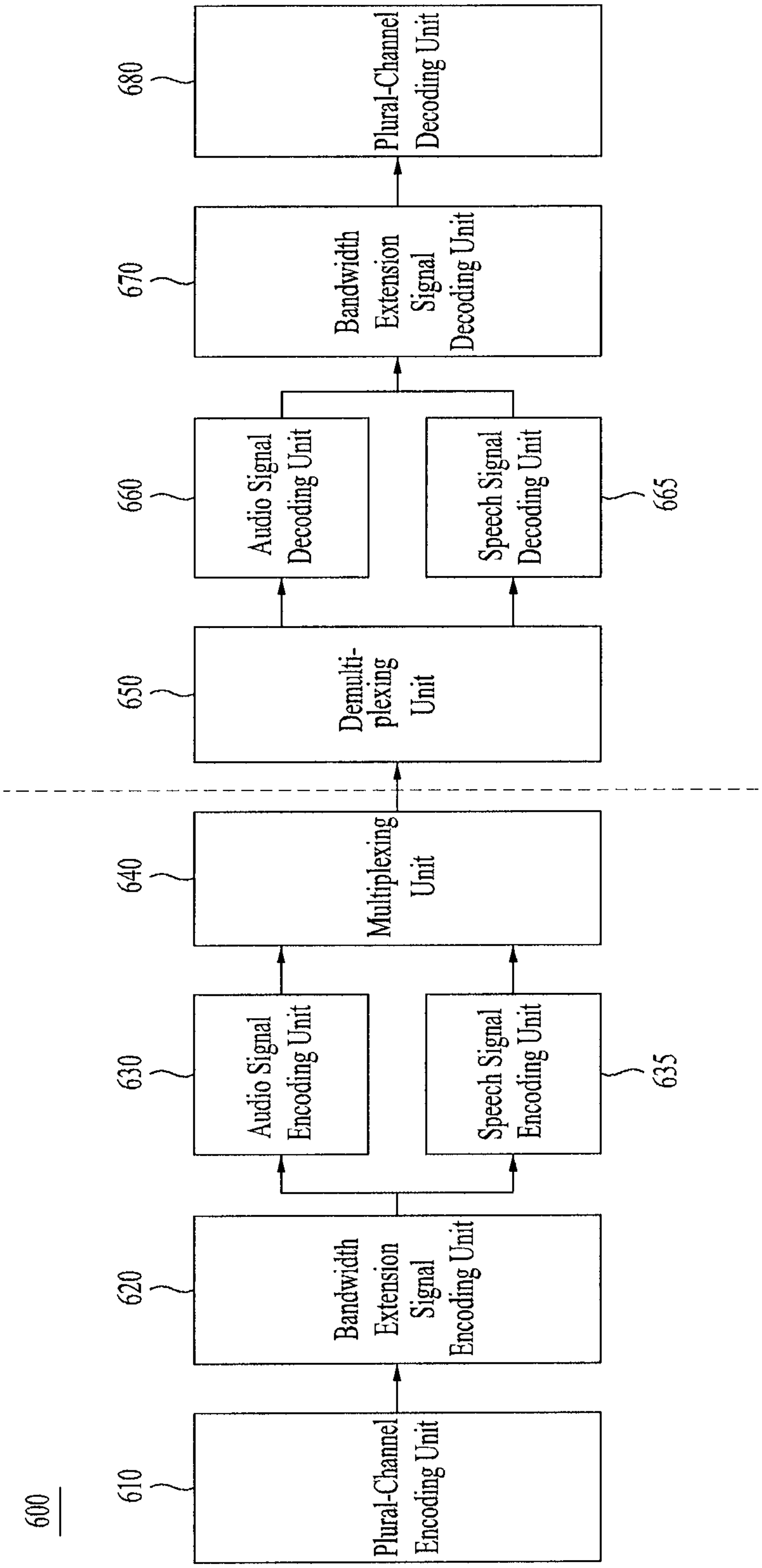
FIG. 6 is a block diagram of a signal processing apparatus according to a further embodiment of the present invention.

FIG. 6 shows a signal processing apparatus 600 according to a further embodiment of the present invention.

Referring to FIG. 6, a signal processing apparatus 600 according to a further embodiment of the present invention includes a plural-channel encoding unit 610, a bandwidth extension signal encoding unit 620, an audio signal encoding unit 630, a speech signal encoding unit 635, a multiplexing unit 640, a demultiplexing unit 650, an audio signal decoding unit 660, a speech signal decoding unit 665, a bandwidth extension signal decoding unit 670 and a plural-channel decoding unit 680.

First of all, a downmix signal, which is generated by the plural-channel encoding unit 610 from downmixing a plural-channel signal, is named a whole band downmix signal. And, a downmix signal, which has a low frequency band only among the whole band downmix signal, is named a low frequency band downmix signal.

The plural-channel encoding unit 610 receives an input of a signal having a plurality of channels (hereinafter called plural-channel). The plural-channel encoding unit 610 generates a whole band downmix signal by downmixing the inputted plural-channel signal and also generates mix information corresponding to the plural-channel signal. In this case, the mix information can contain channel level difference information, channel prediction coefficient, inter-channel correlation information, downmix gain information, etc.

In case that an input signal is an out-of-phase original plural-channel signal, the plural-channel encoding unit 610 according to one embodiment of the present invention generates a plural-channel signal and phase shift information by modifying a phase and then transfers them with mix information. Alternatively, the plural-channel encoding unit 610 just generates and transfer phase shift information to enable a decoder side to shift a phase without modifying a phase of the input signal. This is as good as described with reference to FIG. 2 and its details are omitted.

The bandwidth extension signal encoding unit 620 receives the whole band downmix signal and is then able to generate extension information corresponding to a high frequency band signal in the whole band downmix signal. In this case, the extension information is the information enabling a decoder side to reconstruct a low frequency band downmix signal into the whole band downmix signal. And, the extension information can be transferred together with the mix information.

It is determined whether a downmix signal is coded by an audio signal coding scheme or a speech signal coding scheme based on a signal characteristic. And, mode information for determining the coding scheme is generated [not shown in the drawing]. In this case, the audio coding scheme may use MDCT (modified discrete coefficient transform), by which the present invention is non-limited. And, the speech coding scheme may follow the AMR-WB (adaptive multi-rate wideband) standard, by which the present invention is non-limited.

The audio signal encoding unit 630 encodes the low frequency band downmix signal, from which the high frequency region is removed, according to the audio signal coding scheme using the extension information and the whole band downmix signal inputted from the bandwidth extension signal encoding unit 620.

A signal coded by the audio signal coding scheme can include an audio signal or a signal having a speech signal partially included in an audio signal. And, the audio signal encoding unit 630 may include a frequency-domain encoding unit.

The speech signal encoding unit 635 encodes a low-frequency band downmix signal, from which a high frequency region is removed, according to a speech signal coding scheme using the extension information and the whole band downmix signal inputted from the bandwidth extension signal encoding unit 620.

The signal encoded by the speech signal coding scheme can include a speech signal or an audio signal partially contained in a speech signal. The speech signal encoding unit 635 is able to further use linear prediction coding (LPC) scheme. If an input signal has high redundancy on a time axis, modeling can be performed by linear prediction for predicting a current signal from a past signal. In this case, if the linear prediction coding scheme is adopted, coding efficiency can be raised. Meanwhile, the speech signal encoding unit 635 can include a time-domain encoding unit.

The multiplexing unit 640 generates a bitstream to transmit using an encoded audio signal and an encoded speech signal and mix information including phase shift information and extension information.

The demultiplexing unit 650 is able to separate all signals received from the multiplexing unit 640. The demultiplexing unit 650 may receives a signal encoded according to at least one of an audio coding scheme and a speech coding scheme. This signal can include phase shift information, extension information and a low-frequency band downmix signal as well as mix information.

The audio signal decoding unit 660 decodes the signal according to an audio signal coding scheme. The signal inputted and decoded by the audio signal decoding unit 660 can include an audio signal or a speech signal partially included in an audio signal. And, the audio signal decoding unit 660 can include a frequency-domain decoding unit and is able to use IMDCT (inverse modified discrete coefficient transform).

The speech signal decoding unit 665 decodes a signal according to a speech signal coding scheme. The signal decoded by the speech signal decoding unit 65 can include a speech signal or an audio signal partially included in a speech signal. The speech signal decoding unit 665 can include a time-domain decoding unit and is able to further use linear prediction coding (LPC) scheme.

The bandwidth extension decoding unit 670 receives the low-frequency band downmix signal, which is the signal decoded by the audio signal decoding unit 660 or the speech signal decoding unit 665, and the extension information and then generates a whole band downmix signal of which signal corresponding to the high-frequency region having been removed in encoding is reconstructed.

It is able to generate the whole band downmix signal using the whole low-frequency band downmix signal and the extension information or using the low-frequency band downmix signal in part.

The plural-channel decoding unit 680 receives the whole band downmix signal, the mix information and the phase shift information and then generates a plural-channel signal by applying the mix information to the whole band downmix signal. The plural-channel decoding unit 680 reconstructs an original plural-channel signal based on the phase shift information. Details of this process are described in detail with reference to FIG. 2 and are omitted in the following description.

Thus, in a signal processing method and apparatus according to the present invention, an original plural-channel signal is generated by applying phase shift information to a plural-channel signal reconstructed using a plural-channel decoder, whereby a phase or delay difference difficult to be reproduced by the plural-channel decoder can be effectively reproduced.

A signal processing apparatus using phase shift information of the present invention is applicable to various products to use. The products containing the signal processing apparatus can include a stand-alone group and a portable group. The stand-along group can include a TV, a monitor, a settop box and the like. And, the portable group can include PMP, a mobile phone, a navigation system, and the like.

Figure 7:
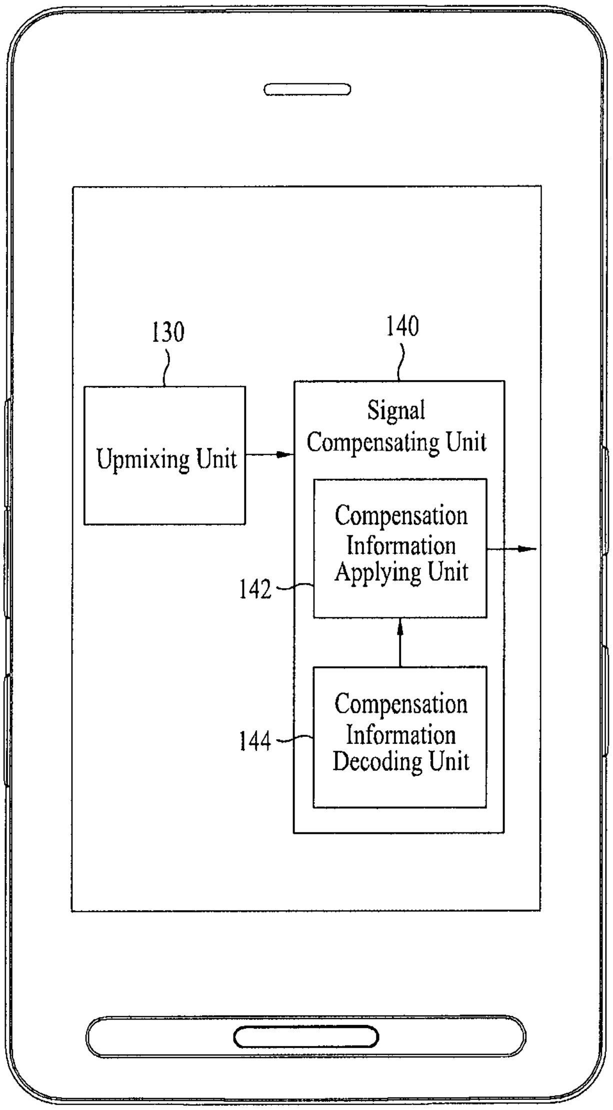
FIG. 7 and FIG. 8 are diagrams of products including a signal processing apparatus of the present invention, respectively.
Figure 8:
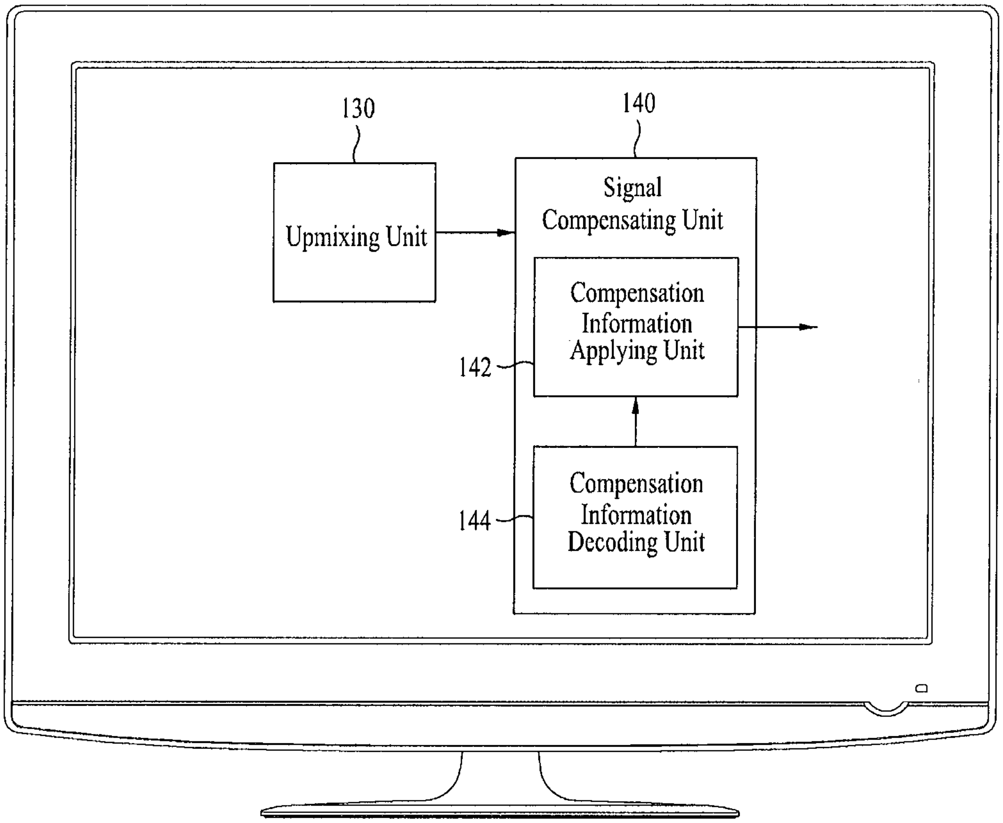

FIG. 7 and FIG. 8 are diagrams of products including a signal processing apparatus of the present invention, respectively.

FIG. 7 shows that a signal processing apparatus of the present invention is loaded in a TV as an example of a stand-alone group. And, FIG. 8 shows that a signal processing apparatus of the present invention is loaded in a mobile phone as an example of a portable group.

Referring to FIG. 7 and FIG. 8, products include a signal processing decoding apparatus of the present invention. The signal processing decoding apparatus includes the upmixing unit 130 and the signal compensating unit 140 shown in FIG. 1. Configurations and roles of the upmixing unit 130 and the signal compensating unit 140 are explained in the foregoing description with reference to FIG. 1 and their details are omitted in the following description.

Accordingly, since a signal processing apparatus of the present invention is included in a product, a sound quality is improved better than that of a related art, which uses an upmixed plural-channel signal, using mix information only. And, a user is able to listen to a signal close to an original plural-channel signal, which is an original input signal.

A decoding/encoding method of the present invention can be implemented in a program recorded medium as computer-readable codes. The computer-readable media include all kinds of recording devices in which data readable by a computer system are stored. The computer-readable media include ROM, RAM, CD-ROM, magnetic tapes, floppy discs, optical data storage devices, and the like for example and also include carrier-wave type implementations (e.g., transmission via Internet). Moreover, a bitstream generated by the encoding method is stored in a computer-readable recording medium or can be transmitted via wire/wireless communication network.

INDUSTRIAL APPLICABILITY

Accordingly, the present invention is applicable to encoding and decoding of signals.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

The invention claimed is:

1. A method of processing a signal, comprising:
decoding a low-frequency band downmix signal by using at least one of a speech coding scheme and an audio coding scheme;
reconstructing a high-frequency band downmix signal by using the low-frequency band downmix signal;
generating a downmix signal by adding the low-frequency band downmix signal and the high-frequency band downmix signal, the downmix signal generated by downmixing a plural-channel signal in an encoder;
receiving mix information and phase shift information on the plural-channel signal;
upmixing the downmix signal to the plural-channel signal by applying the mix information to the downmix signal; and
generating an original plural-channel signal by shifting a phase of at least one channel of the plural-channel signal by a same phase for a whole frequency band, based on the phase shift information.

2. The method of claim 1, wherein the original plural-channel signal is shifted the phase of the at least one channel by $\pi/2$.

3. The method of claim 1, wherein the phase shift information is variable per frame.

4. The method of claim 1, wherein the phase shift information is variable per subband.

5. The method of claim 1, wherein the generating of the original plural-channel signal further uses gain compensation information to compensate a gain lost in generating the downmix signal.

6. A method of processing a signal, comprising:
decoding a low-frequency band downmix signal by using at least one of a speech coding scheme and an audio coding scheme;
reconstructing a high-frequency band downmix signal by using the low-frequency band downmix signal;
generating a downmix signal by adding the low-frequency band downmix signal and the high-frequency band downmix signal, the downmix signal generated by downmixing a plural-channel signal in an encoder;
receiving mix information on the plural-channel signal and gain compensation information on the plural-channel signal;
upmixing the downmix signal into the plural-channel signal by applying the mix information to the downmix signal; and
generating an original plural-channel signal by adjusting a gain of at least one channel of the plural-channel signal based on the gain compensation information.

7. An apparatus for processing a signal, comprising:
an audio signal decoding unit decoding a low-frequency band downmix signal by using an audio coding scheme;
a speech signal decoding unit decoding a low-frequency band downmix signal by using a speech coding scheme;
a bandwidth extension signal decoding unit reconstructing a high-frequency band downmix signal by using the low-frequency band downmix signal, and generating a downmix signal by adding the low-frequency band downmix signal and the high-frequency band downmix signal, the downmix signal generated by downmixing a plural-channel signal in an encoder;
an upmixing unit receiving mix information and phase shift information on the plural-channel signal, and upmixing the downmix signal into the plural-channel signal by applying the mix information to the downmix signal; and a signal shifting unit generating an original plural-channel signal by shifting a phase of at least one channel of the plural-channel signal based on the phase shift information.

8. The apparatus of claim 7, wherein the signal shifting unit generates the original plural-channel signal by shifting the phase of the at least one channel by $\pi/2$.

9. The apparatus of claim 7, wherein the phase of the at least one channel of the plural-channel signal is shifted by a same phase for a whole frequency band.

10. The apparatus of claim 7, wherein the phase shift information is variable per frame.

11. The apparatus of claim 7, wherein the phase shift information is variable per subband.

* * * * *